(12) United States Patent
Song

(10) Patent No.: US 8,169,346 B2
(45) Date of Patent: May 1, 2012

(54) APPARATUS AND METHOD FOR PROCESSING PARALLEL DIGITAL INPUT SIGNALS FROM PLURALITY OF CIRCUIT BREAKERS

(75) Inventor: Min Cheol Song, Gyeonggi-Do (KR)

(73) Assignee: LS Industrial Systems Co., Ltd., Gyeonggi-do (KR)

( * ) Notice: Subject to any disclaimer, the term of this patent is extended or adjusted under 35 U.S.C. 154(b) by 83 days.

(21) Appl. No.: 12/783,628

(22) Filed: May 20, 2010

(65) Prior Publication Data

US 2010/0302080 A1 Dec. 2, 2010

(30) Foreign Application Priority Data

Jun. 2, 2009 (KR) .................. 10-2009-0048772

(51) Int. Cl.
*H03M 9/00* (2006.01)

(52) U.S. Cl. ........ 341/101; 307/203; 307/350; 307/245; 307/219; 307/286

(58) Field of Classification Search .......... 341/110–101, 341/144–155; 370/203, 350, 522, 257, 245, 370/286, 219

See application file for complete search history.

(56) References Cited

U.S. PATENT DOCUMENTS

| 4,161,651 A | | 7/1979 | Sano et al. | |
|---|---|---|---|---|
| 4,588,986 A | * | 5/1986 | Byrne | 341/101 |
| 5,016,011 A | * | 5/1991 | Hartley et al. | 341/101 |
| 5,384,678 A | | 1/1995 | Ebersohl et al. | |
| 6,433,718 B2 | * | 8/2002 | Strinnholm | 341/144 |
| 6,950,044 B1 | * | 9/2005 | Piasecki et al. | 341/155 |
| 7,057,538 B1 | * | 6/2006 | D'Amore | 341/70 |
| 7,180,437 B1 | * | 2/2007 | Bandy et al. | 341/101 |
| 7,312,735 B2 | * | 12/2007 | Bandy et al. | 341/101 |
| 7,773,006 B2 | * | 8/2010 | Tinker | 341/100 |
| 2010/0090874 A1 | * | 4/2010 | Saito | 341/118 |
| 2010/0283651 A1 | * | 11/2010 | Dura et al. | 341/150 |

FOREIGN PATENT DOCUMENTS

| DE | 3935157 | 5/1991 |
|---|---|---|
| JP | 53-113401 | 10/1978 |
| JP | 61-71735 | 4/1986 |
| JP | 4-67826 | 6/1992 |
| JP | 2000-354339 | 12/2000 |

OTHER PUBLICATIONS

"Liner Applications of Optocouplers: Application Note 951-2", Agilent Technologies, Inc., retrieved from the internet on Sep. 30, 2010, pp. 1-6, URL:http://linearparts.com/documents/AN-HCPL2531-5954-8430.pdf.
"FOD8001 High Noise Immunity, 3.3V/5V Logic Gate Optocoupler", Fairchild Semiconductor Corporation, Mar. 2009, pp. 1-12, URL:http://www.fairchildsemi.com/ds/FO%2FFOD8001.pdf.
JP Office Action in 2010-124434. dated Aug. 23, 2011.

* cited by examiner

*Primary Examiner* — Lam T Mai

(74) *Attorney, Agent, or Firm* — Greenblum & Bernstein, P.L.C.

(57) ABSTRACT

An apparatus for processing digital input signals transferred from a plurality of circuit breakers includes: a plurality of signal input terminals configured to receive a plurality of digital input signals, which are generated from the plurality of circuit breakers and indicate an ON/OFF state of the plurality of circuit breakers, in parallel; a digital input signal parallel-to-serial converting unit configured to convert the parallel digital input signals from the plurality of signal input terminals into serial digital input signals, and output the converted serial digital input signals according to a control signal; and a controller configured to receive and process the serial digital input signals transferred from the digital input signal parallel-to-serial converting unit, and transmit the control signal to the digital input signal parallel-to-serial converting unit.

6 Claims, 4 Drawing Sheets

APPARATUS AND METHOD FOR PROCESSING PARALLEL DIGITAL INPUT SIGNALS FROM PLURALITY OF CIRCUIT BREAKERS

CROSS-REFERENCE TO A RELATED APPLICATION

Pursuant to 35 U.S.C. §119(a), this application claims the benefit of earlier filing date and right of priority to Korean Application No. 10-2009-00 48772, filed on Jun. 2, 2009, the contents of which is incorporated by reference herein in its entirety.

BACKGROUND OF THE INVENTION

1. Field of the Invention

The present invention relates to an apparatus and method for processing is parallel digital signals, indicating an ON or OFF state of a plurality of circuit breakers, inputted from the plurality of circuit breakers.

2. Description of the Related Art

In general, a circuit breaker is a power switching device for providing an electric power, which is to be inputted to an industrial load device, or breaking an electric power supply according to the state or size of an electric current of a circuit connected by a control signal. In general, a power distributing board installed at an electrical power incoming section of a substation or a large-scale electric power consumer includes a main circuit breaker for switching a main circuit of led power and a plurality of sub-circuit breakers for switching a plurality of distributing circuits, and performs a function of managing a state of the circuit breakers or monitoring a state of a switching operation of the circuit breakers.

In the power distributing board, a monitoring device such as a digital relay receives digital input signals, indicating an ON/OFF or trip state, transferred from the plurality of circuit breakers, so the received digital input signals need to be processed.

FIG. 1 is a schematic block diagram of an apparatus for processing a plurality of digital input signals according to the related art.

As shown in FIG. 1, an apparatus 4 for processing a plurality of digital input signals outputted from a plurality of circuit breakers according to the related art includes a plurality of digital input signal input terminals 1 that receive signals, in parallel, outputted from the circuit breakers, photo couplers 2 that insulates noise so as not to be transferred, and transfers only the digital input signals, and a central processing unit (abbreviated as CPU hereinafter) 3 that receives the plurality of digital data, in parallel, transferred from the plurality of photo couplers 2, and process them.

One of the relates arts is configured such that the photo couplers is not provided and the digital input signals are directly inputted to the CPU 3 without passing through the photo couplers 2.

The plurality of digital input signals may include, besides signals indicating an ON/OFF or trip status of the circuit breaker, digital input signals transferred from industrial devices such as motors, pumps, valves, and the like. The digital input signals provide information required for a user to monitor and manage the corresponding circuit breaker or the industrial devices.

However, the related art apparatus and method for processing digital input signals have the following problems.

That is, because the plurality of digital input signals are inputted and processed in parallel, the same number of photo couplers as the number of the digital input signals, the same number of input and output ports of the CPU as the number of the digital input signals are required, for which, thus, a Printed Circuit Board (abbreviated as PCB hereinafter) having a larger area is required to cause a problem in that the size of the monitoring and managing apparatus increases.

In addition, when the input ports of the CPU are limitedly used or when the monitoring and managing apparatus is configured based on digital input signals with a limited PCB, only information particularly required by the user or only some of a plurality of received digital input signals are limitedly processed by the CPU according to the intention of a developer who develops a corresponding apparatus is/are processed, causing a problem in that the function of the monitoring and managing apparatus is limited.

SUMMARY OF THE INVENTION

Therefore, in order to address the above matters, the various features described herein have been conceived.

A first object of the present invention is to provide an apparatus for processing a digital input signal capable of processing a maximum number of digital input signals by using a minimum number of control parts and input ports by minimizing a limitation in parallel inputs, thus effectively configuring a PCB of the apparatus for processing a digital input signal and reducing the size of the PCB.

A second object of the present invention is to provide an apparatus for processing a digital input signal capable of minimizing the configuration of a photo coupler for insulating a noise signal in comparison with a plurality of digital input signals.

A third object of the present invention is to provide a method for effectively processing a plurality of digital input signals inputted in parallel by configuring the minimum hardware.

In order to achieve the first object, there is provided an apparatus for processing digital input signals transferred from a plurality of circuit breakers, comprising: a plurality of signal input terminals configured to receive a plurality of digital input signals, which are generated from the plurality of circuit breakers and indicate an ON/OFF state of the plurality of circuit breakers, in parallel; a digital input signal parallel-to-serial converting unit configured to convert the parallel digital input signals from the plurality of signal input terminals into serial digital input signals, and output the converted serial digital input signals according to a control signal; and a controller configured to receive and process the serial digital input signals transferred from the digital input signal parallel-to-serial converting unit, and transmit the control signal to the digital input signal parallel-to-serial converting unit.

In order to achieve the second object, the apparatus may further include: a noise insulating unit provided between the digital input signal parallel-to-serial converting unit and the controller and removing an input noise signal, except for transmitted and received data and the control signal.

In order to achieve the third object, there is provided a method for processing digital input signals from a plurality of circuit breakers, including: an input signal reception step of receiving a plurality of digital input signals in parallel; and a parallel-to-serial converting step of grouping data according to the parallel digital input signals inputted in the input signal reception step into a plurality of groups, converting the parallel digital input signals by groups into serial digital data by groups, and collectively outputting the serial digital data of the groups, as one serial digital data.

DETAILED DESCRIPTION OF THE INVENTION

The foregoing and other objects, features, aspects and advantages of the present invention will become more apparent from the following detailed description of the present invention when taken in conjunction with the accompanying drawings.

An apparatus 100 for processing digital input signals from a plurality of circuit breakers according to preferred embodiments of the present invention will now be described with reference to FIGS. 2 to 4.

Figure 1:
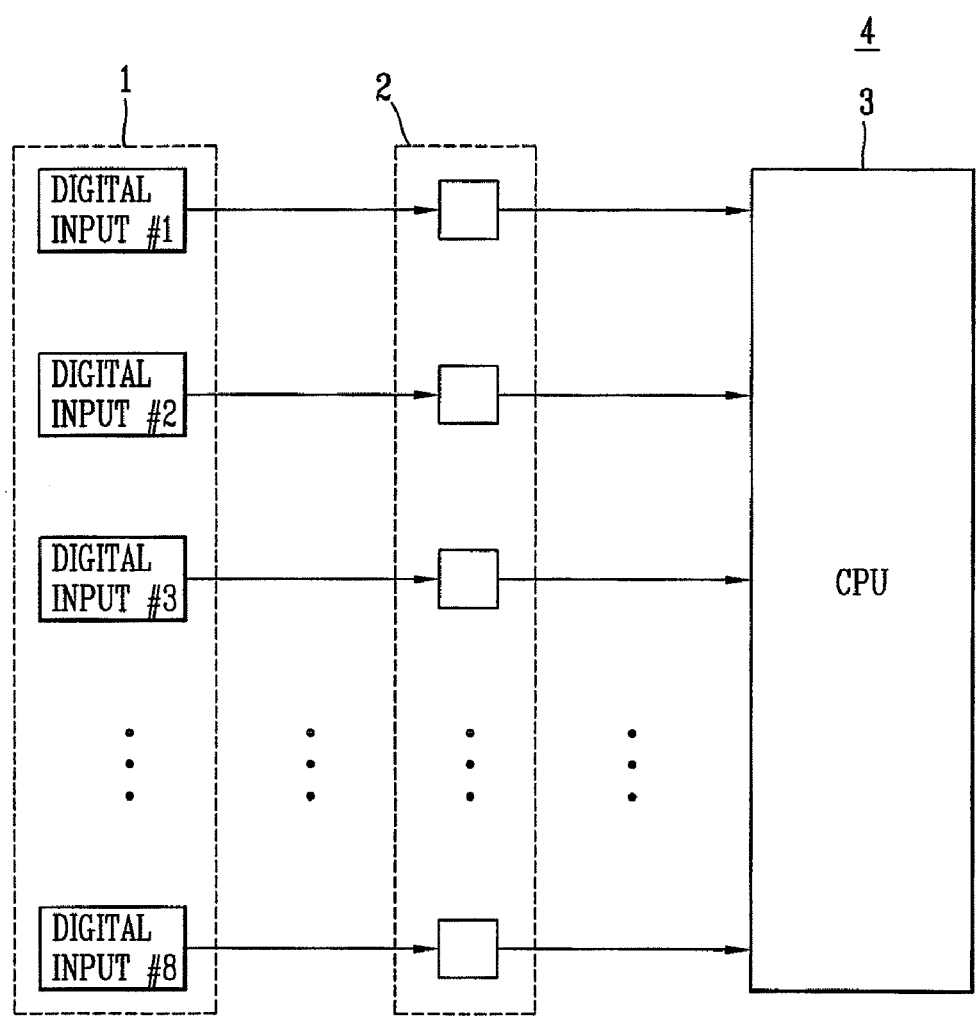
FIG. 1 is a schematic block diagram of an apparatus for processing a plurality of digital input signals according to the related art.
Figure 2:
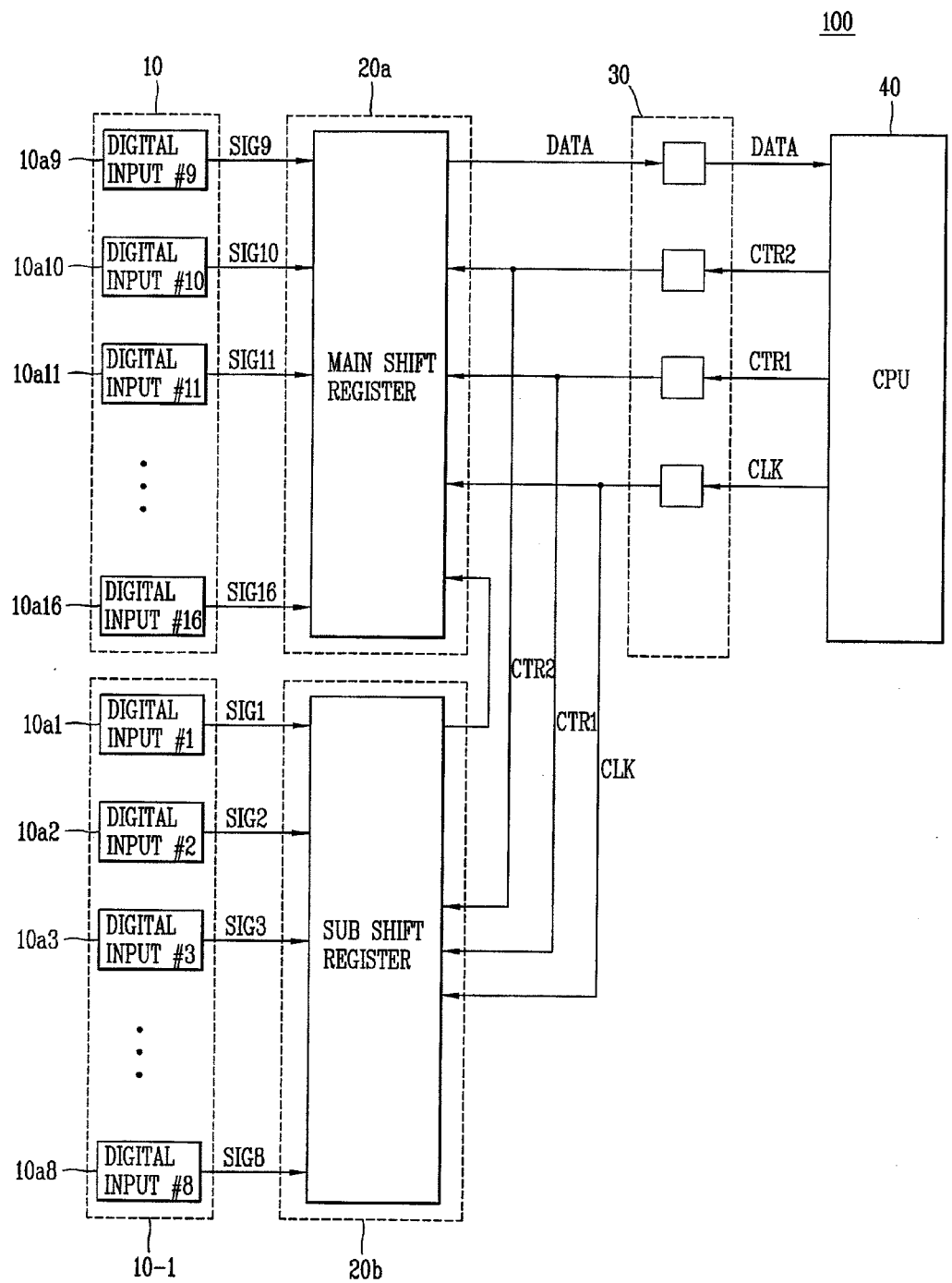
FIG. 2 is a schematic block diagram of an apparatus for processing digital input signals from a plurality of circuit breakers according to a preferred embodiment of the present invention.

As shown in FIG. 2, the apparatus 100 for processing digital input signals from a plurality of circuit breakers includes a plurality of signal input terminals 10a1~10a16, digital input signal parallel-to-serial converting units 20a and 20b, and a controller 40.

Also, as shown in FIG. 2, the apparatus 100 for processing digital input signals from a plurality of circuit breakers according to an exemplary embodiment of the present invention further comprises a noise insulating unit 30 provided between a main shift register 20a of the digital input signal parallel-to-serial converting units 20a and 20b and the controller 40, and insulating an interposing of a noise signal, except transmitted or received data and a control signal.

The plurality of signal input terminals 10a1~10a16 are input units for receiving a plurality of digital input signals which are generated from the plurality of circuit breakers (Refer to 110 in FIG. 4) and indicate an ON/OFF state of the plurality of circuit breakers 110. For example, when the plurality of signal input terminals 10a1~10a16 are configured as sixteen signal input terminals, they may be grouped into a first group of signal input terminals 10a1~10a8 and a second group of signal input terminals 10a9~10a16.

The digital input signal parallel-to-serial converting units 20a and 20b convert parallel digital input signals from the plurality of signal input terminals 10a1~10a16 into serial digital input signals, and output the converted serial digital input signals according to a control signal. As shown in FIG. 2, the digital input signal parallel-to-serial converting units 20a and 20b comprise at least one sub-shift register 20b and a main shift register 20a.

The sub-shift register 20b receives a first group of parallel digital input signals SIG1~SIG8 from the first group of signal input terminals 10a1~10a8, converts them into first serial digital input signals (no reference numerals given), and outputs the first serial digital input signals according to the control signal.

The main shift register 20a receives a second group of parallel digital input signals SIG9~SIG16 from the second group of signal input terminals 10a9~10a16, converts them into second serial digital input signals (not reference numerals given), gathers the converted second serial digital input signals and the first serial digital input signals which have been received from the sub-shift register 20b, and output them as a single serial digital input signal to the controller 40.

The controller 40 receives the serial digital input signal from the main shift register 20a of the digital input signal parallel-to-serial converting unit and processes it, and then transmits the control signal to the digital input signal parallel-to-serial converting units 20a and 20b. In a preferred embodiment, the controller 40 may be configured as a central processing unit (CPU) of a microprocessor. Here, as shown in FIG. 2, the control signal includes a periodical clock signal CLK and at least one control signal for requesting the digital input signal parallel-to-serial converting units 20a and 20b to output a serial digital input signal. In a preferred embodiment, as shown in FIG. 2, the control signal for requesting the digital input signal parallel-to-serial converting units 20a and 20b to output the serial digital input signal may include a first control signal CTR1 and a second control signal CTR2 for requesting the main shift register 20a and the sub-shift register 20b to output the serial digital input signal. In a preferred embodiment, when the controller 40 outputs a low level signal as the second control signal CTR2 to the sub-shift register 20b and, at the same time, outputs a high edge signal to the main shift register 20a, the sub-shift register 20b outputs a first serial digital input signal to the main shift register 20a in response and the main shift register 20a gathers the first and second serial digital input signals and outputs them as a single serial digital input signal to the controller 40.

In a preferred embodiment, the noise insulating unit 30 may comprise four photo couplers as shown in FIG. 2. Here, among the four photo couplers of the noise insulating unit 30, one photo coupler is installed at a path that receives the serial digital input signal from the main shift register 20a, two photo couplers are installed at a transmission path of the first control signal CTR1 and the second control signal CTR2 outputted from the controller 40 to the main shift register 20a and the sub-shift register 20b. The remaining one photo coupler is installed at a transmission path of the periodical clock signal CLK outputted from the controller 40 to the main shift register 20a and the sub-shift register 20b. Accordingly, a noise signal can be prevented from being interposed in the serial digital input signal or the control signal as transmission and reception signals between the controller 40 and other elements by virtue of the noise insulating unit 30 comprised of the four photo couplers.

A detailed configuration of the main shift register 20a and the sub-shift register 20b having the substantially same configuration will now be described with reference to FIG. 3.

Figure 3:
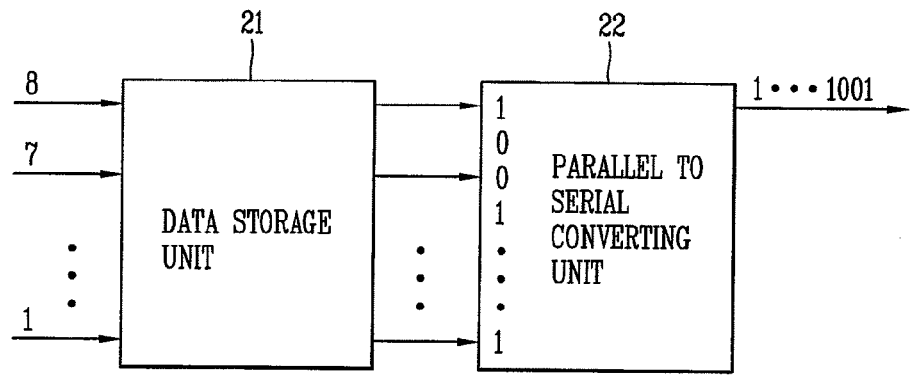
FIG. 3 is a detailed block diagram of a main shift register and a sub-shift register of FIG. 2.

As shown in FIG. 3, the main shift register 20a and the sub-shift register 20b include a data storage 21 for receiving a plurality of parallel digital data according to the first group of eight parallel digital input signals SIG1~SIG8 or the second group of eight parallel digital input signals SIG9~SIG16 from the first group of signal input terminals 10a1~10a8 or the second group of signal input terminals 10a9~10a16, and storing them, and a parallel-to-serial converting unit 22 for converting the parallel digital data stored in the data storage 21 into serial digital data and outputting the same.

Namely, the data storage 21 simultaneously receives eight digital input signals including binary 0 or 1 in parallel from the first group of signal input terminals 10a1~10a8 or the second group of signal input terminals 10a9~10a16 as shown in FIG. 2. The parallel-to-serial converting unit 22 receives the eight digital input signals from the data storage 21, sequentially store in order from the input #1 to the input #8, and then outputs them from the input #8 to the input #1 in a reverse order, whereby the parallel digital data which had been input in parallel are converted into serial data and thusly outputted.

A preferred embodiment of an overall system configured to comprise a plurality of circuit breakers, the apparatus for processing digital input signals from the plurality of circuit breakers, and a host system for monitoring operational states of the plurality of circuit breakers based on the processed data from the apparatus according to an embodiment of the present invention will now be described with reference to FIG. 4.

Figure 4:
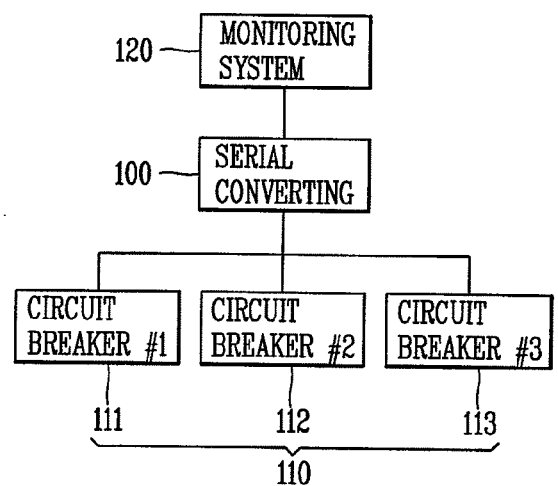
FIG. 4 is a schematic block diagram showing a preferred configuration embodiment of an overall system including a plurality of circuit breakers, an apparatus for processing digital input signals from the plurality of circuit breakers, and a monitoring system for monitoring an operational state of the plurality of circuit breakers based on processed data from the apparatus for processing digital input signals.

As shown in FIG. 4, when a plurality of circuit breakers 111, 112, and 113 output operational state information and are subjected to management and monitoring, digital input signals indicating a closed or open state of circuits are transmitted from the plurality of circuit breakers 111, 112, and 113 to the apparatus 100 for processing the digital input signals. Then, the apparatus 100 for processing the digital input signals from the plurality of circuit breakers, which are configured and operate as described above, according to an exemplary embodiment of the present invention converts the plurality of digital input signals which have been received in parallel, into serial digital input signals, in other words, into serial digital input data, processes the same, and transmits the serial digital input signals, namely, as information indicating an open or closed state of circuits of the plurality of circuit breakers 110 to the host system 120.

The host system 120 is a user monitoring system including, for example, a user interface means such as a computer including a monitor, a lamp, a buzzer, a key board, a user interface program. The host system 120 may display state information of monitoring targets, namely, the plurality of circuit breakers, a plurality of motors, a plurality of valves, a plurality of pumps, and the like, by means of the user interface means based on the serial digital input signals, namely, the serial digital input data. Also, the serial digital input signals, namely, the serial digital input data as state information of an industrial site to be monitored and managed may be utilized as base data of user's manual management or automatic management according to a program.

In the embodiment illustrated in FIG. 4 shows the configuration in which only three circuit breakers are connected to the system. In this embodiment, the sub-shift register 20b is not required for the apparatus 100 for processing digital input signals from the plurality of circuit breakers according to the preferred embodiment of the present invention illustrated in FIG. 2.

Meanwhile, the operation of the apparatus for processing the digital input signals from the plurality of circuit breakers and a method for processing digital input signals from the plurality of circuit breakers according to an exemplary embodiment of the present invention will now be described with reference to FIGS. 2 to 6.

Figure 5:
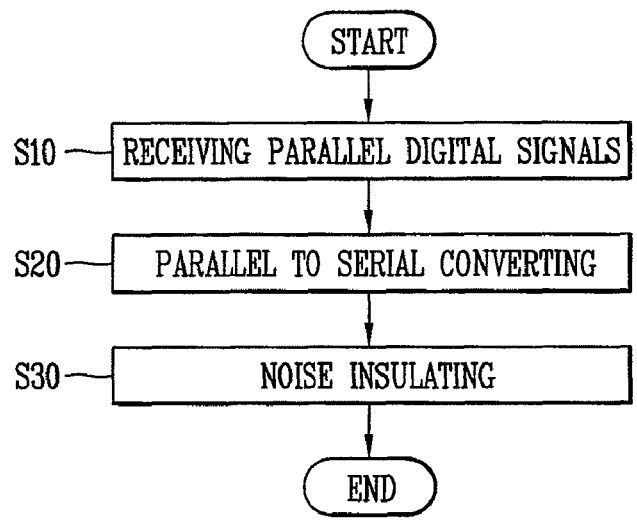
FIG. 5 is a flow chart illustrating the operation of the apparatus for processing digital input signals from a plurality of circuit breakers or the process of a method for processing digital input signals from a plurality of circuit breakers.
Figure 6:
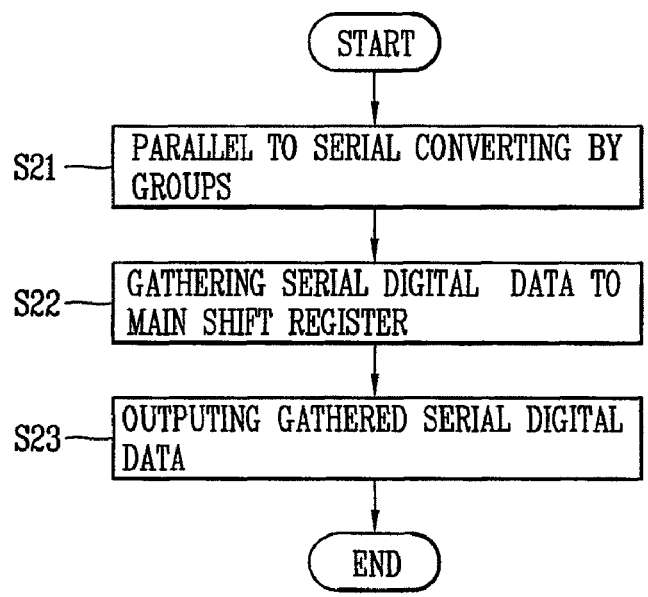
FIG. 6 is a flow chart illustrating a detailed operation or a detailed process of the method in step S20 in FIG. 5.

FIG. 5 is a flow chart illustrating the operation of the apparatus for processing digital input signals from a plurality of circuit breakers or the process of a method for processing digital input signals from a plurality of circuit breakers, to and FIG. 6 is a flow chart illustrating a detailed operation or a detailed process of the method in step S20 in FIG. 5.

As shown in FIG. 5, the method for processing digital input signals from the plurality of circuit breakers according to an exemplary embodiment of the present invention includes: an input signal receiving step S10 of receiving a plurality of digital input signals in parallel; and a parallel-to-serial converting step S20 of grouping data according to the parallel digital input signals inputted in the input signal receiving step into a plurality of groups to convert them into serial digital data by groups, gathering the serial digital data of each group, and outputting them as single serial digital data.

In the input signal receiving step S10, the digital input signal parallel-to-serial converting units 20a and 20b as shown in FIG. 2 receive digital input signals indicating an ON/OFF state f the circuit breakers 110 in parallel from the plurality of circuit breakers 110 as shown in FIG. 4.

In the parallel-to-serial converting step S20, the sub-shift register 20b as shown in FIG. 2 receives the first group of parallel digital input signals SIG1~SIG8 from the first group of signal input terminals 10a1~10a8, converts them into serial digital input signals (no reference numeral given), and outputs the first serial digital input signals according to the control signal. The main shift register 20a receives the second group of parallel digital input signals SIG9~SIG16 from the second group of signal input terminals 10a9~10a16, converts them into second serial digital input signals (no reference numeral given), gathers the converted second serial digital input signals and the first serial digital input signals which have been received from the sub-shift register 20b, and outputs them as a single serial digital input signal to the controller 40.

The method for processing the digital input signals from the plurality of circuit breakers according to a preferred embodiment of the present invention may further include a noise insulating step S30 of insulating an interposing of noise into the serial digital data outputted in the parallel-to-serial converting step.

In the noise insulating step S30, as shown in FIG. 2, an interposing of a noise signal into the serial digital input signals or the control signal as transmission and reception signals between the controller 40 and the other elements can be insulated to be prevented by the noise insulating unit 30 comprising four photo couplers.

The step S20 in FIG. 5 will be described in detail with reference to FIG. 6.

As shown in FIG. 6, the parallel-to-serial converting step S20 includes a group parallel-to-serial converting step S21 (parallel-to-serial converting in groups), a serial data gathering step S22 (gathering serial digital data to main shift register), and a final serial converted data outputting step S23 (outputting gathered serial digital data).

In the group parallel-to-serial converting step S21, the data received in the input signal receiving step S10 is grouped into a plurality of groups by the single main shift register 20a and at least one sub-shift register 20b and converted into serial data.

In the serial data gathering step S22, the serial digital data group-converted in the group parallel-to-serial converting step S21 is gathered to the main shift register 20a as shown in FIG. 2.

In the final serial converted data outputting step S23, the serial data gathered in the serial data gathering step S22 is outputted as single final serial converted data by the main shift register 20a so as to be processed by a CPU corresponding to the controller 40 in FIG. 2.

In more detail, the plurality of circuit breakers 111 to 113 transmits an ON/OFF or trip state signal by switching a relay (not shown) provided within the circuit breakers 111 to 113.

If the part that is to receive the state information is not insulated by the noise insulating unit 30, a surge instantly generated when the relay is switched may cause the CPU corresponding to the controller 40 to be broken down. Thus, the present invention proposes the optical signal transmission configuration by the photo couplers of the noise insulating unit 30 such that even if such a surge signal is interposingly included in the circuit of the apparatus 100 for processing the digital input signals from the plurality of circuit breakers according to a preferred embodiment of the present invention, the CPU corresponding to the controller 40 is not affected. Thus, the controller 40 and other circuit parts can be separated or insulated from noise.

As described above, the apparatus and method for processing digital input signals from the plurality of circuit breakers have the following advantages.

That is, because the plurality of digital input signals are converted into serial digital input signals, the signal lines between the CPU for processing the corresponding digital input signals and the input unit of the digital input signals can be simplified into three control lines and one data line.

Also, because the signal lines between the CPU for processing the corresponding digital input signals and the input unit of the digital input signals can be simplified into three control lines and one data line, the number of input ports occupied by the digital input signals from the plurality of circuit breakers, among the input ports of the CPU, can be reduced, and also the number of photo couplers for insulating noise can be reduced. Accordingly, the size of the PCB constituting the apparatus for processing the digital input signals from the plurality of circuit breakers can be considerably reduced.

As the present invention may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. An apparatus for processing digital input signals transferred from a plurality of circuit breakers, the apparatus comprising:
   a plurality of signal input terminals configured to receive a plurality of parallel digital input signals, which are generated from the plurality of circuit breakers and indicate an ON/OFF state of the plurality of circuit breakers;
   a digital input signal parallel-to-serial converting unit configured to convert the parallel digital input signals from the plurality of signal input terminals into serial digital input signals, and output the converted serial digital input signals according to a control signal;
   a controller configured to receive and process the serial digital input signals transferred from the digital input signal parallel-to-serial converting unit, and transmit the control signal to the digital input signal parallel-to-serial converting unit; and
   a noise insulating unit provided between the digital input signal parallel-to-serial converting unit and the controller and insulating an input noise signal.

2. The apparatus of claim 1, wherein the digital input signal parallel-to-serial converting unit comprises:
   at least one single sub-shift register configured to receive first group parallel digital input signals from the signal input terminals of a first group, convert them into first serial digital input signals, and output the first serial digital input signals according to the control signal; and
   a main shift register configured to receive second group parallel digital input signals from the signal input terminals of a second group, convert them into second serial digital input signals, and collectively output the converted second serial digital input signals and the first serial digital input signals which have been received from the sub-shift register, as a single serial digital input signal to the controller.

3. The apparatus of claim 2, wherein the control signal comprises a periodical clock signal and at least one control signal.

4. The apparatus of claim 2, wherein the sub-shift register and the main shift register, respectively, comprise:
   a data storage unit configured to receive the plurality of digital input signals inputted in parallel from the plurality of signal input terminals and store data corresponding to the digital input signals; and
   a parallel-to-serial converting unit configured to output the plurality of digital data, stored in the data storage unit, in series.

5. A method for processing digital input signals from a plurality of circuit breakers, the method comprising:
   receiving a plurality of parallel digital input signals;
   grouping the parallel digital input signals into a plurality of groups, converting the parallel digital input signals by groups into serial digital data by groups, and collectively outputting the serial digital data of the groups, as one serial digital data signal; and
   insulating noise contained in the serial digital data signal.

6. The method of claim 5, wherein:
   grouping the parallel digital input signals comprises grouping the parallel digital input signals into a plurality of groups by a single main shift register and at least one sub-shift register; and
   collectively outputting the serial digital data comprises gathering the serial digital data by the main shift register; and outputting the gathered serial digital data as final serial conversion data from the main shift register so as to be processed by a central processing unit.

* * * * *